(12) United States Patent
Tredwell

(10) Patent No.: US 8,129,810 B2
(45) Date of Patent: Mar. 6, 2012

(54) CONTINUOUS LARGE AREA IMAGING AND DISPLAY ARRAYS USING READOUT ARRAYS FABRICATED IN SILICON-ON-GLASS SUBSTRATES

(75) Inventor: Timothy J. Tredwell, Fairport, NY (US)

(73) Assignee: Carestream Health, Inc., Rochester, NY (US)

( * ) Notice: Subject to any disclaimer, the term of this patent is extended or adjusted under 35 U.S.C. 154(b) by 188 days.

(21) Appl. No.: 12/488,074

(22) Filed: Jun. 19, 2009

(65) Prior Publication Data

US 2010/0320556 A1 Dec. 23, 2010

(51) Int. Cl.
H01L 31/00 (2006.01)
(52) U.S. Cl. .................. 257/443; 257/444; 257/E21.598
(58) Field of Classification Search ................... 257/443, 257/444, E21.598
See application file for complete search history.

(56) References Cited

U.S. PATENT DOCUMENTS

| 7,176,528 | B2 | 2/2007 | Couillard et al. | |
| 7,192,844 | B2 | 3/2007 | Couillard et al. | |
| 7,268,051 | B2 | 9/2007 | Couillard et al. | |
| 7,569,832 | B2 * | 8/2009 | Tredwell et al. | 250/370.11 |
| 2008/0067324 | A1 * | 3/2008 | Heiler et al. | 250/208.1 |

* cited by examiner

Primary Examiner — Luan C Thai

(57) ABSTRACT

A vertically-integrated image sensor is proposed with the performance characteristics of single crystal silicon but with the area coverage and cost of arrays fabricated on glass. The image sensor can include a backplane array having readout elements implemented in silicon-on-glass, a frontplane array of photosensitive elements vertically integrated above the backplane, and an interconnect layer disposed between the backplane array and the image sensing array. Since large area silicon-on-glass backplanes are formed by tiling thin single-crystal silicon layers cleaved from a thick silicon wafer side-by-side on large area glass gaps between the tiled silicon backplane would normally result in gaps in the image captured by the array. Therefore, embodiments further propose that the pixel pitch in both horizontal and vertical directions of the frontplane be larger than the pixel pitch of the backplane, with the pixel pitch difference being sufficient that the frontplane bridges the gap between backplane tiles.

22 Claims, 12 Drawing Sheets

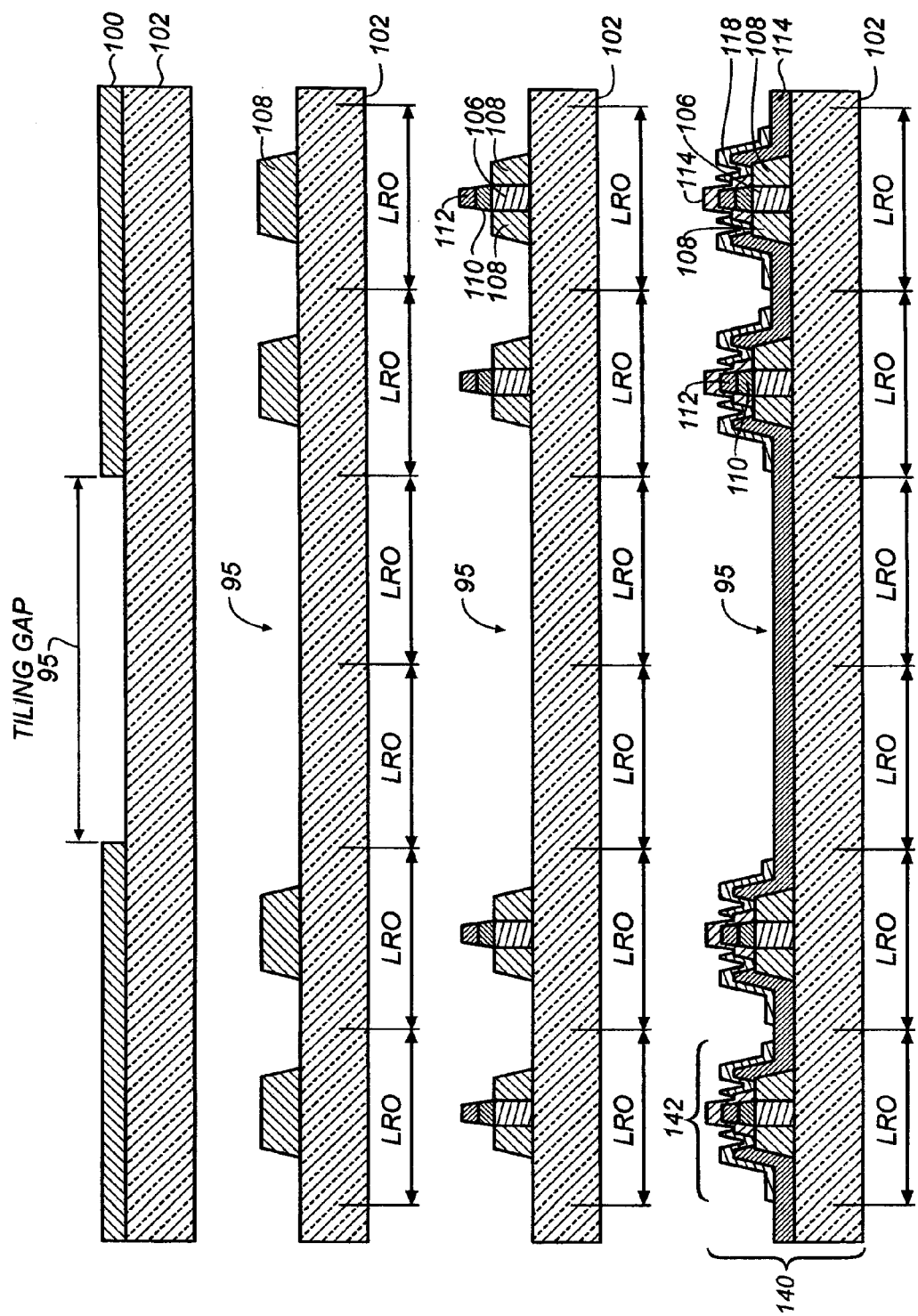

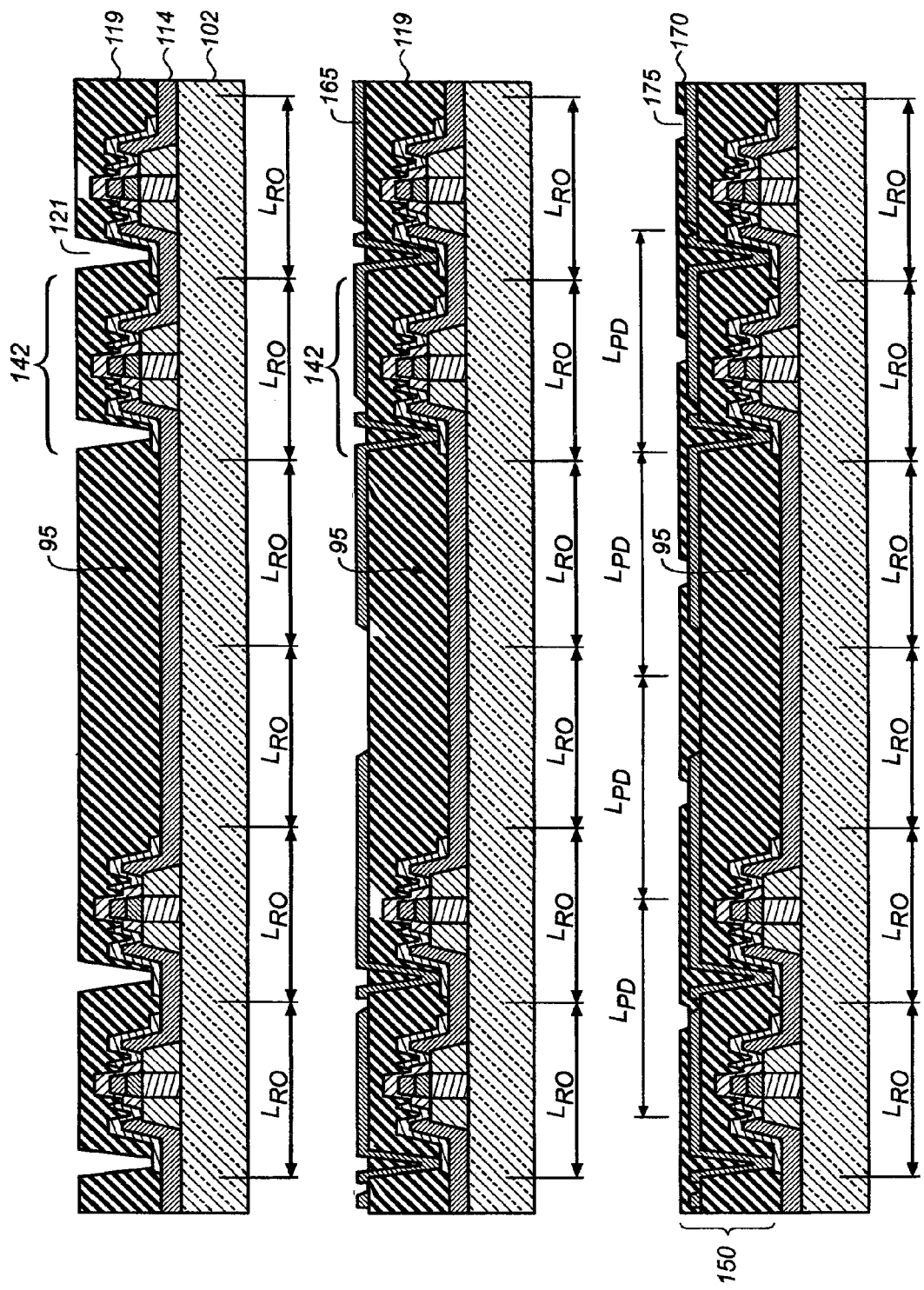

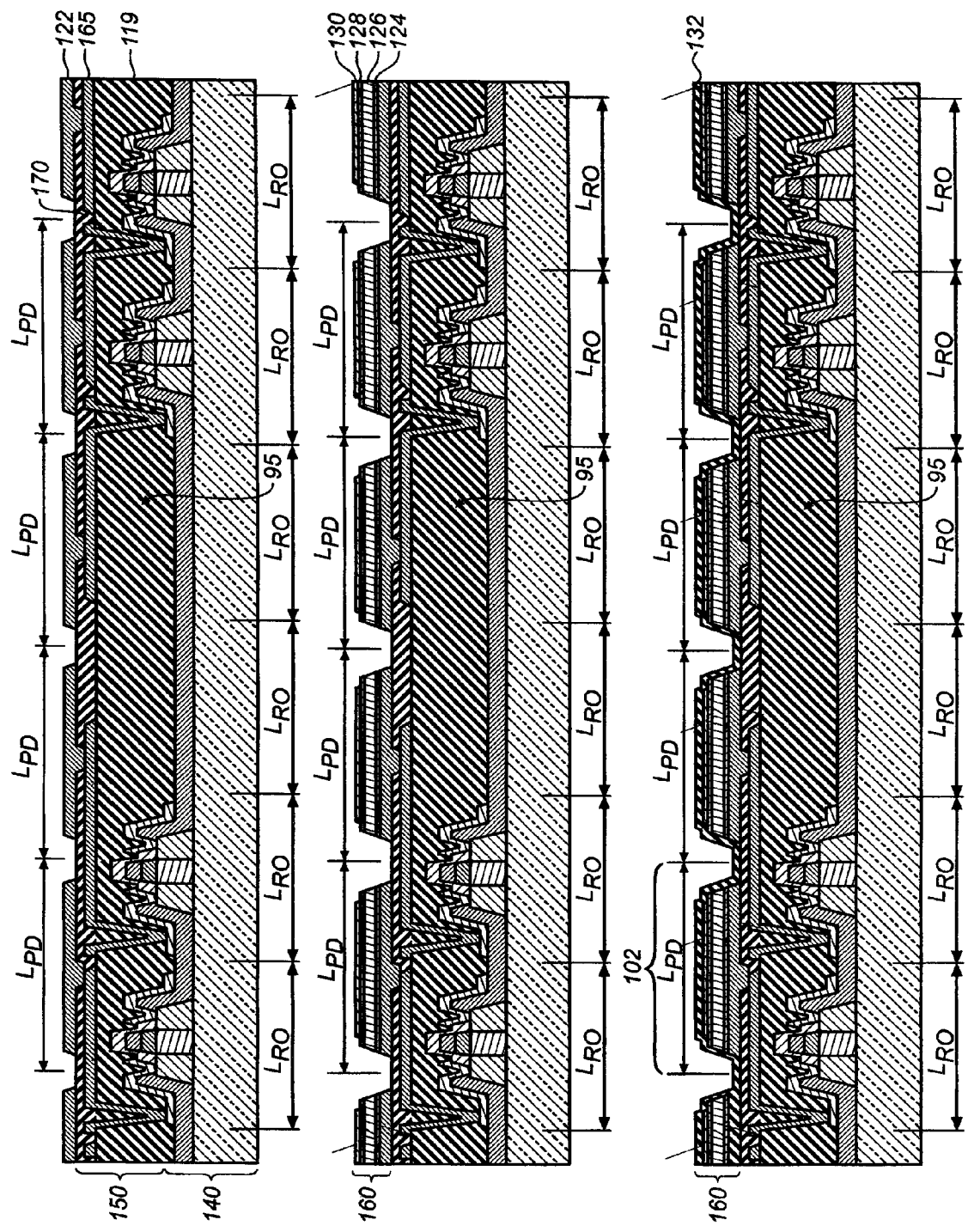

CONTINUOUS LARGE AREA IMAGING AND DISPLAY ARRAYS USING READOUT ARRAYS FABRICATED IN SILICON-ON-GLASS SUBSTRATES

TECHNICAL FIELD

Embodiments relate to imaging arrays and more specifically to vertically integrated image sensing arrays formed using address and readout circuits formed in silicon on glass for visible and X-ray image sensing applications.

DESCRIPTION OF RELATED ART

Image sensors can be formed either in single-crystal silicon wafers or in deposited semiconductors on glass. The former have superior signal-to-noise characteristics and a high degree of integration, but cannot be made larger than the size of one silicon wafer and have a high cost per unit area due to wafer processing costs. The latter have inferior signal-to-noise characteristics and a low degree of integration, but can be fabricated over a large area without gaps in an imaging area and are lower in cost per unit area than the former. Image sensors fabricated in single-crystal silicon are generally applied to applications requiring small image area, such as digital cameras. Image sensors fabricated from deposited semiconductors, for example, amorphous or polycrystalline silicon, are generally applied to applications requiring large image area, such as digital radiography.

To form image arrays having dimensions greater than the dimension of a single crystal wafer, multiple single crystal wafers can be arranged side-by-side or tiled on a large area substrate, such as glass or ceramic. Such large area arrays have tiling gaps between the tiled silicon wafers, which result in gaps between the formed image arrays. These image array gaps are visible in images generated therefrom. Currently, removal of these image artifacts requires complex optical relay systems involving imaging or non-imaging optics, which adds cost, size and weight to the imaging systems and can cause artifacts in generated images due to the distortion introduced by the imaging optics.

A substrate that is now being used for large area arrays is Silicon-On-Glass (SiOG), which is a new class of substrate material in which thin silicon slices are attached to a large-area glass substrate. The process is described in patents U.S. Pat. Nos. 7,176,528, 7,192,844, and 7,268,051 assigned to Corning Inc, all of which are hereby incorporated in their entirety by reference. FIG. 1 generally illustrates the SiOG manufacturing process. In step (a), single-crystal silicon wafers are ion-implanted with hydrogen to form a buried hydrogen-rich and highly defective layer below the surface of the silicon. Depending on the energy of the ion-implant, the layer can be approximately 200 nm to 2 μm below the silicon surface. The mechanical strength of the hydrogen-implanted layer is significantly lower than the mechanical strength of the silicon wafer, allowing separation of a silicon surface layer from the underlying wafer by, for example, mechanical cleaving. The round silicon wafers are cut to form squares in a manner designed to minimize crystalline damage to the edge of the wafers and are attached to large area glass substrates by anodic ion bonding as shown in 1(b). In step 1(c) the separation layer is enlarged and the silicon wafer is separated from the thin silicon surface layer at the hydrogen-implanted boundary during the bonding process as shown in steps (d) to (e), leaving a thin silicon layer attached to the glass. Multiple silicon wafers can be tiled on the glass, with tiling gaps between the wafers that are typically about 200 microns to 1 mm or more. The thin silicon squares attached to the glass substrate are polished to form a uniform and thin (e.g., about 100 nm-2 μm thick) layer.

FIG. 2 shows a top down illustration and a photograph of a glass substrate 102 (370 mm×470 mm) with four silicon wafers 100 bonded thereto and polished in preparation for device fabrication. The manufacturing process results in tiling gaps, each tiling gap having boundaries defined by the edges of the tiles, separating the individual silicon tiles as shown. Alternative methods can be used for bonding silicon wafers with an internal separation layer to glass by, for example, frit bonding, adhesive bonding, or solder attach.

SUMMARY OF THE INVENTION

Embodiments relate to improved image sensing devices including imaging arrays, imaging arrays that cover tiling gaps of SiOG substrates, and radiographic imaging apparatus that include the imaging arrays.

In an embodiment, an imaging array is provided. The imaging array can include an insulating substrate bonded with at least one thin single-crystal silicon substrate (or layer), wherein the thin single-crystal substrate is of a thickness about equal to or less than 1 micron. The imaging array also can include a backplane array including readout elements formed in the at least one thin single-crystal silicon substrate and a frontplane array including photosensitive elements formed above the backplane array on the at least one thin single-crystal substrate. In addition, the photosensitive elements can be formed in amorphous silicon. Also, the photosensitive elements can be selected from p-n junction photodiodes, PIN junction photodiodes, MIS sensors, avalanche photodiodes, photoconductors, and photo-transistors. The frontplane is electrically connected to the backplane.

Embodiments also include, a glass insulating substrate and bonded to the at least two thin single-crystal silicon substrates, the thin single-crystal silicon substrates equal to or less than about 1 μm. The imaging array also can include a backplane array including readout elements formed in the single-crystal silicon substrates and a frontplane array including photosensitive elements above and on the side of the readout array opposite the insulating substrate. In addition, the photosensitive elements can be formed in amorphous silicon. Also, the photosensitive elements can be selected from p-n junction photodiodes, PIN junction photodiodes, MIS sensors, avalanche photodiodes, photoconductors, and photo-transistors. The relationship between $L_{PD}$ and $L_{RO}$ is $L_{PD}/L_{RO}=1+\delta L/L$ where L is the width of a single-crystal silicon substrate and $\Delta L$ is the tiling gap.

In another embodiment, another imaging array is provided. The second imaging array can include an insulating substrate bonded to at least two single-crystal silicon substrates, where the single-crystal silicon substrates are separated by a tiling gap and wherein the thin single-crystal substrates are of a thickness about equal to or less than 1 micron. The imaging array also can include a backplane array including readout elements formed in the single-crystal silicon substrates, each readout element having a pitch $L_{RO}$, and a frontplane array including photosensitive elements above and on the side of the readout array opposite the insulating substrate, each photosensitive element having a pitch $L_{PD}$. The frontplane is electrically connected to the backplane, and in the proximity of the tiling gap $L_{PD}>L_{RO}$ the photosensitive elements cover at least a portion of the tiling gap. The condition $L_{PD}>L_{RO}$ can be achieved by increasing $L_{PD}$ in the proximity of the of the tiling gap as compared to $L_{PD}$ not in the proximity of the tiling gap, by decreasing $L_{RO}$ in the proximity of the tiling gap as compared to $L_{RO}$ not in the proximity of the tiling gap, or both. In addition, the photosensitive elements can be formed in amorphous silicon. Also, the photosensitive elements can be selected from p-n junction photodiodes, PIN junction photodiodes, MIS sensors, avalanche photodiodes, photoconductors, and photo-transistors.

An additional embodiment can include a method of manufacturing an imaging array. The method can include providing a silicon-on-glass (SiOG) substrate including at least one thin single-crystal silicon substrate bonded to an insulating substrate, wherein the thin single-crystal substrate is of thickness equal to or less than 1 micron. The method also can include forming a readout array in the at least one single-crystal silicon substrate and forming a photosensitive array.

The SiOG substrate step further including two or more thin single-crystal silicon substrates tiled on the insulating substrate that are separated by a tiling gap of approximately 10 microns to 5 mm. The method also can include forming the readout array on the insulating substrate with a first element pitch and forming the photosensitive array with a second element pitch. Additionally, the second element pitch is greater than the first element pitch and the photosensitive array covers at least a portion of the tiling gap.

The method can further include forming an interconnect layer between the backplane and the frontplane to electrically connect the readout elements with the photosensitive elements. The at least two single-crystal silicon substrates can be n-doped or p-doped and the insulating substrate can be glass. The photosensitive elements can be p-n junction photodiodes, PIN junction photodiodes, MIS sensors, pinned photodiodes, CCDs, avalanche photodiodes, photo-transistors, photoconductors or charge injection devices. The readout elements can be transistors, diode switches, CCDs, bi-polar transistors, or field effect transistors.

The SiOG substrate can be formed using anodic bonding, frit bonding, or soldering between the insulating substrate and the at least two thin single-crystal silicon substrates. The SiOG substrate can be formed by implanting the at least two single-crystal silicon substrates with hydrogen to form an internal separation boundary, and removing a portion of the at least two single-crystal silicon substrates at the internal separation boundary to provide an exposed thin silicon surface. The exposed silicon surface can be polished, masked, and etched. Following the removing step, the exposed silicon surface can have a thickness of between about 20 nm and 2 microns.

BRIEF DESCRIPTION OF THE DRAWINGS

Various features of the embodiments can be more fully appreciated as the same become better understood with reference to the following detailed description of the embodiments when considered in connection with the accompanying figures.

FIGS. 5A-5C show cross sections of the fabrication process of an imaging array according to an embodiment.

DESCRIPTION OF EMBODIMENTS

Figure 1:
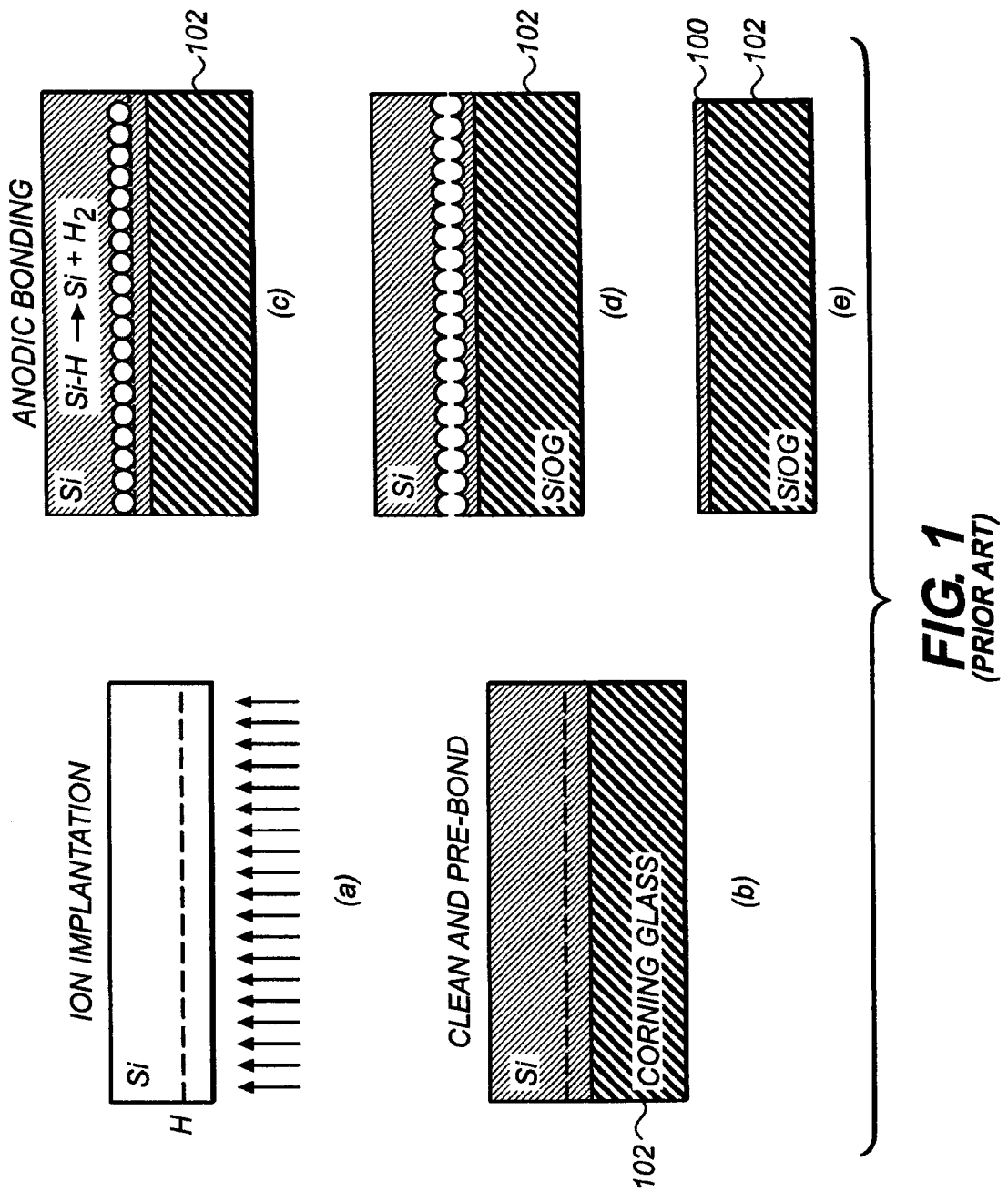
FIG. 1 shows a known process of forming a silicon on glass (SiOG) substrate using a Corning process.

Reference will now be made in detail to the present embodiments (exemplary embodiments) of the invention, an example of which is illustrated in the accompanying drawings. Wherever possible, the same reference numbers will be used throughout the drawings to refer to the same or like parts.

For simplicity and illustrative purposes, the principles of the present invention are described by referring mainly to exemplary embodiments thereof. However, one of ordinary skill in the art would readily recognize that the same principles are equally applicable to, and can be implemented in, all types of secure distributed environments and that any such variations do not depart from the true spirit and scope of the present invention. Moreover, in the following detailed description, references are made to the accompanying figures, which illustrate specific embodiments. Electrical, mechanical, logical and structural changes can be made to the embodiments without departing from the spirit and scope of the present invention. The following detailed description is, therefore, not to be taken in a limiting sense and the scope of the present invention is defined by the appended claims and their equivalents.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value equal to or greater than zero and a maximum value equal to or less than 10, e.g., 1 to 5.

Pitch, as used herein, is defined as the length or repeated spacing of a given element. For example, backplane or readout element pitch is used herein to describe the repeating distance between each readout element in an array. Similarly, frontplane or photodiode/photosensing/etc. pitch is used herein to describe the repeating distance between each photodiode element in an array. An imaging element or pixel can include at least readout element and at least one photodiode/photosensing element. The SiOG substrate is formed from at least one silicon wafer and an insulating substrate, where the final SiOG substrate can include the insulating substrate with a thin single-crystal silicon layer bonded thereto. The photosensing element converts electromagnetic radiation from at least one portion of the electromagnetic spectrum, including gamma rays to infrared radiation, into electrical charge.

Embodiments pertain generally to imaging arrays and methods of manufacturing the same using SiOG substrates. More particularly, embodiments include vertically integrated imaging arrays where the readout elements in a backplane have a smaller pitch than the photosensitive elements in a frontplane, and methods of manufacturing thereof. Embodiments form the backplane in thin (e.g., equal to or less than 2 microns) single-crystal silicon, which can be part of an SiOG substrate. For example, devices fabricated in thin silicon layers have electronic properties superior to amorphous or polycrystalline silicon. Thin-film-transistors in silicon-on-glass, for example, display significantly higher carrier mobility for both electrons and holes, sharp turn-on characteristics (sub-threshold slope), low leakage current, are capable of forming both NMOS and PMOS devices for CMOS circuits, and improved stability over extended use.

The vertically-integrated image sensors provided have the performance characteristics of single crystal silicon but with the area coverage and cost of arrays fabricated on glass. Embodiments of the image sensor arrays include a backplane array including readout elements implemented in silicon-on-glass, a frontplane array comprised of photosensitive elements vertically integrated above (e.g., on the backplane array and opposite the insulating layer) the backplane, and an interconnect layer disposed between the backplane array and the frontplane array, which electrically connects the backplane and the frontplane. To form large area silicon-on-glass backplanes, thin single-crystal silicon layers cleaved from thick silicon wafers are arranged side-by-side and/or tiled on a large area glass substrate. However, gaps between the tiled silicon backplane can result in gaps in the image captured by the imaging array. In order to avoid this problem, the element pitch in both the horizontal and vertical directions of the frontplane can be larger than the element pitch of the backplane, with the element pitch difference being sufficient that the frontplane bridges at least a portion of the gap between backplane at the tiling boundary.

Figure 3:
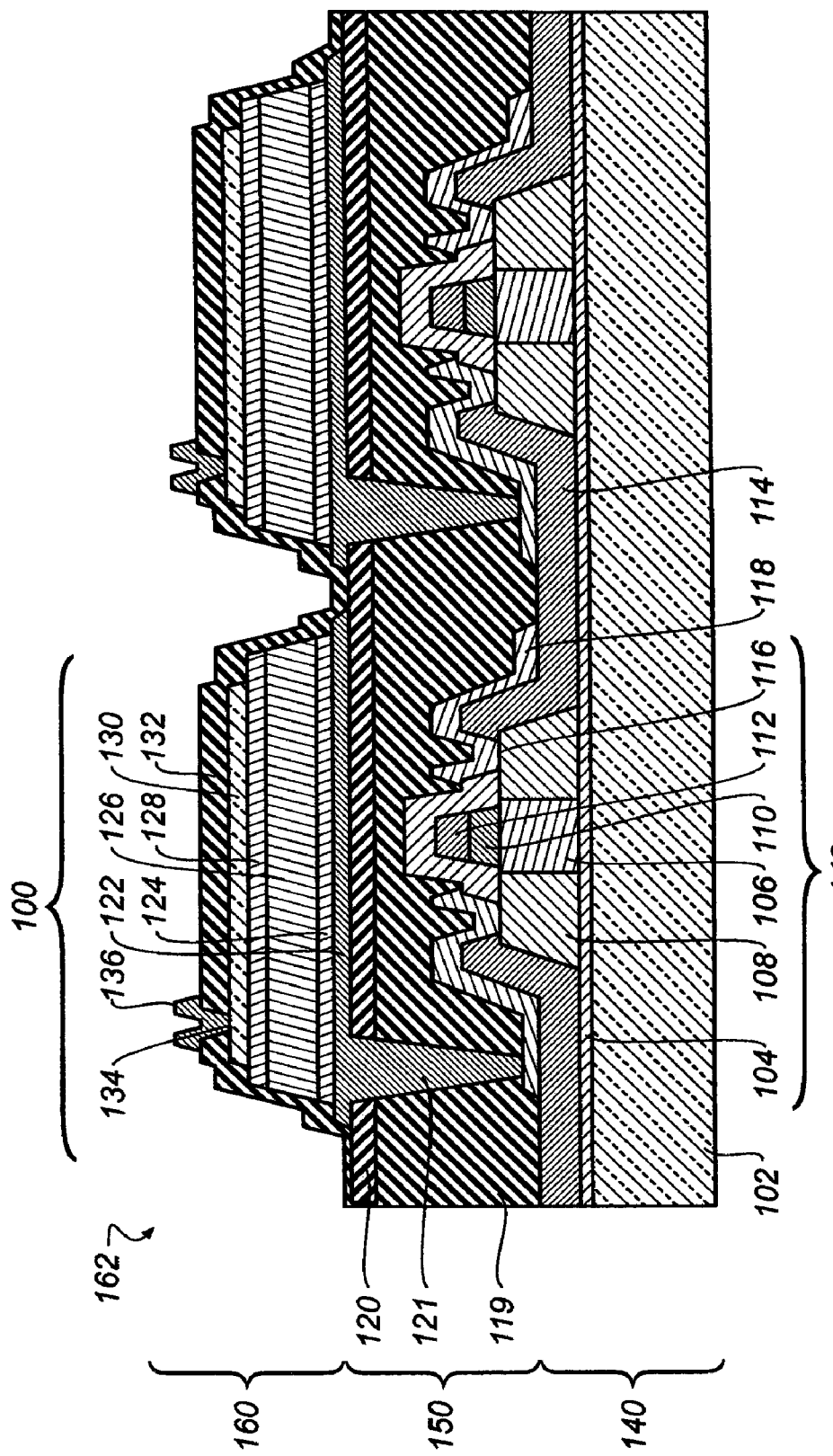
FIG. 3 is a cross section of an imaging array according to an embodiment.

FIG. 3 is a cross-section of a pixel of an imaging array according to an embodiment. The pixel 100 can be of a backplane 140, a frontplane 160 and an interconnect layer 150 disposed between the frontplane and the backplane. Interconnect layer 150 connects photo-sensors 162 on the frontplane 160 with readout elements 142 on the backplane 140. The backplane 140 can include glass substrate 102, patterned thin single-crystal silicon layer 106 and bonding layer 104 by which the single crystal silicon layer 106 can be attached to glass substrate 102. Thin single-crystal silicon layer 106 has a thickness of about less than 1 micron. The imaging array shown in FIG. 3 includes a single silicon layer/tile.

Figure 2:
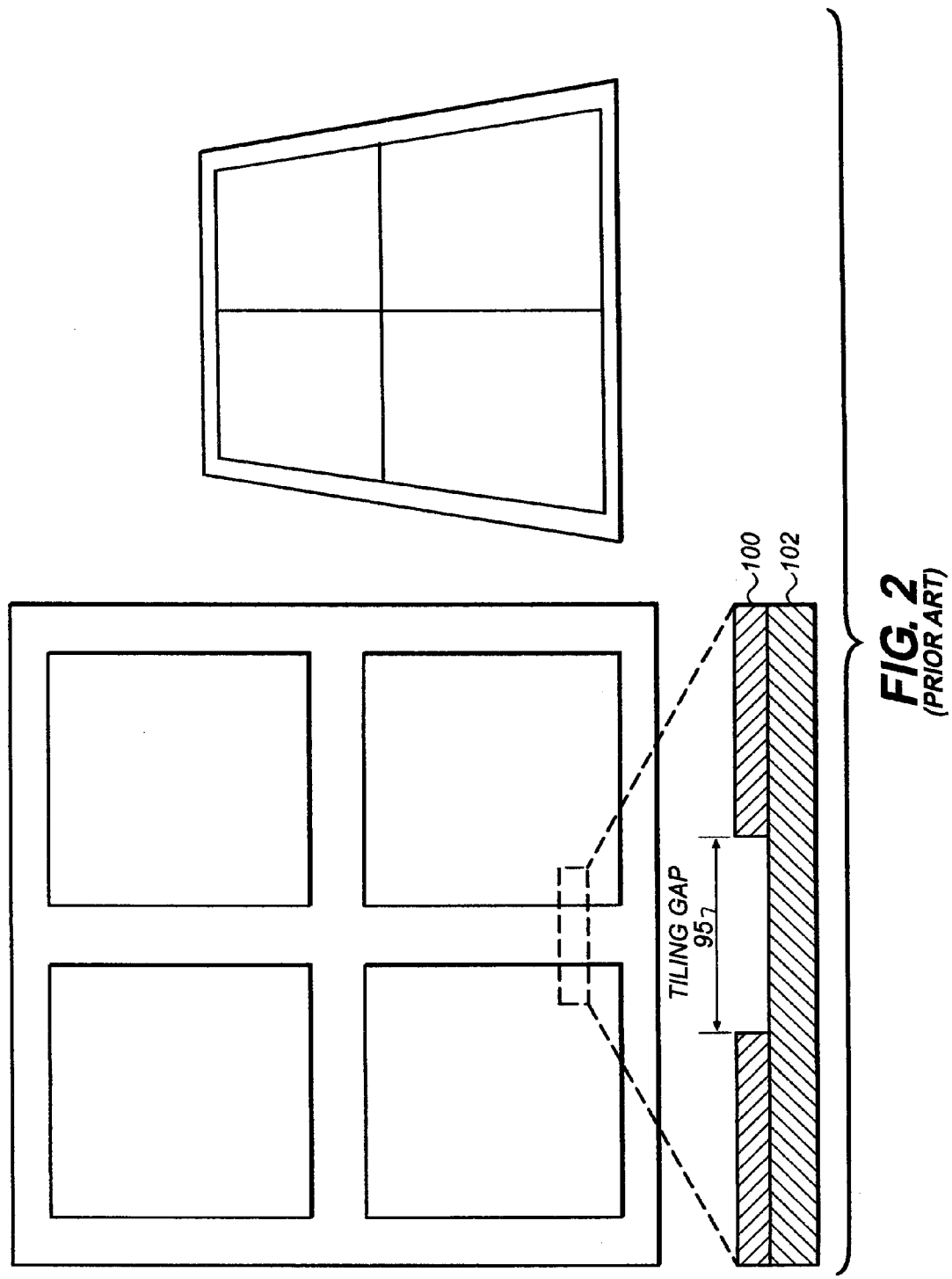
FIG. 2 shows two views of a large area glass substrate having four silicon wafers attached thereto.

The thin single crystal silicon layer 106 can be formed from a silicon wafer (see FIGS. 1 and 2) in which an internal separation layer has been formed by hydrogen ion implantation. The bonding layer 104 can be an anodic bond formed between the silicon wafer side (not shown) proximate the internal separation layer and the glass substrate 102 through the application of a combination of heat, pressure and voltage as discussed above. After separation, the thin silicon layer (not shown) can be polished to remove surface damage and roughness to within 20 nm rms surface roughness. Readout elements 142 (e.g., transistors, etc.) are then formed in the patterned thin single-crystal silicon layer 106. The readout elements include, gate dielectric 110, a first level of metal forming gate electrode 112, and doped regions 108. To form doped regions 108, thin silicon layer 106 can be doped with a p-type dopant, e.g., boron, for PMOS transistors or an n-type dopant, e.g., phosphorous or arsenic, for NMOS transistors. In one embodiment, the readout elements are formed from a lightly p-type doped ($1 \times 10^{15} cm^{-3}$) thin silicon layer 106 with heavily doped ($1 \times 10^{18} cm^{-3}$) boron source and drain regions 108 formed by ion-shower doping over the surface of the large-area flat-panel glass substrate 102. The readout elements 142 in the backplane 140, can further include inter-metal dielectric 114, vias 116 formed in the inter-metal dielectric 114 connecting first metal 112 and the second level of metal 118, and connecting second level of metal 118 and doped regions 108 to form device source and drain regions 108.

It will be noted by one skilled in the art that other active devices, for example, NMOS transistors, bipolar transistors and p-n junction diodes, as well as other passive devices, for example, metal-insulator-metal capacitors, metal-insulator-silicon capacitors, resistors formed in doped regions 108, inductors formed from first metal layer 112 and/or second metal layer 118, etc., can be formed in the backplane 140.

Also shown in FIG. 3, interconnect layer 150 can include a first inter-layer dielectric 119, a second inter-layer dielectric 120, and vias 121 formed in the first and second inter-layer dielectrics 119, 120. In one embodiment, the first dielectric 119 is, for example, deposited silicon nitride, and the second dielectric 120 is, for example, silicon dioxide. In an alternative embodiment, the first dielectric 119 can be an organic dielectric, such as benzocyclobutene (BCB), and the second dielectric can be, e.g., silicon nitride. The first example of the first 119 and second 120 dielectrics, offers an all-inorganic process compatible with flat-panel display processing while the second example offers planarization of backplane topography and reduced capacitance between circuit elements in the backplane and circuit elements in the frontplane.

The frontplane 160 can include PIN photodiodes 162 formed in amorphous silicon. The PIN photodiodes 162 include a cathode 122, an N+ doped amorphous silicon layer 124, an intrinsic amorphous silicon layer 126, a P+ doped amorphous silicon layer 128, an anode 130, a passivation dielectric 132, and a metal layer 136. Cathode 122 can be formed of, for example, Mo about 150 nm thick. N+ doped amorphous silicon layer 124 can be, for example, amorphous silicon heavily doped with phosphorous that can be about 100 nm thick. The intrinsic amorphous silicon layer 126 can be about 500-1,500 nm thick and the P+ doped amorphous silicon layer 128 can be, for example, amorphous silicon heavily doped with boron and can be about 10-50 nm thick. Anode 130 can be formed, for example, of a transparent conductor, e.g., indium tin oxide (ITO), and can be about 10-100 nm thick. Finally, the passivation dielectric 132, is, e.g., a silicon nitride layer, about 100-400 nm thick containing vias 134, and the fifth level of metal 136, can include a stack of about 50 nm Mo, 200 nm Al and 50 nm Mo.

One of ordinary skill in the art will recognize that while the above embodiments are shown on a single silicon wafer, multiple silicon wafers can also be used. Additionally, it will be realized by one skilled in the art that alternative backplane embodiments, such as a diode switching matrix, can be substituted for a transistor-based backplane described herein. Also, one of skill in the art will recognize that various dielectric layers can be used and/or stacked to form the various dielectric layers.

In addition, while the frontplane 160 is discussed using an amorphous silicon PIN photodiode for detection of visible light, one of skill in the art would recognize that other visible light photosensors can be substituted for the amorphous silicon PIN photodiode, including, for example, MIS photosensors, vertical p-n junction photodiodes, lateral p-n junction photodiodes, photoconductors, photo-transistors fabricated from inorganic, organic semiconducting materials, etc. It will also be realized by one skilled in the art that alternative frontplane embodiments can be substituted for the PIN photodiode, including MIS photo-capacitors, phototransistors, or photoconductors. In addition, for indirect X-ray detectors employing these photosensors, an X-ray conversion screen, such as CsI or $Gd_2O_2S$:Tb, would be positioned in proximity with the photosensors. Also, for direct X-ray detectors, X-ray sensitive photosensors, such as photoconductors can be employed in the frontplane. Examples of materials for X-ray sensitive photoconductors include amorphous selenium and CdTe.

Embodiments also include vertically-integrated large-area image sensors using multiple SiOG substrates, in which the readout elements in the backplane are formed in the SiOG substrates and the photosensing elements in the frontplane are formed with deposited semiconductor layers, such as amorphous silicon. In these embodiments, multiple SiOG substrates are used in a side-by-side or tiling arrangement on a large-area glass substrate. In order to eliminate tiling gaps between multiple silicon substrates on the glass, the horizontal and vertical pitch of the readout elements on the backplane are smaller than the horizontal and vertical pitch of the photosensing elements on the frontplane. For example, if the desired photosensor pixel pitch in the frontplane is $L_{PD}$, the pitch of the pixels on the backplane formed in the silicon tiles are $L_{RO}$, then the ratio of the pitch in the frontplane to the backplane is given by equation 1:

$$L_{PD}/L_{RO} = 1 + \Delta L/L \quad (1)$$

where L is the width of the silicon tile and $\Delta L$ is the width of the gap between tiles. The difference in pixel pitch allows the photosensors in the frontplane, which are vertically-integrated above (e.g., on the backplane array and opposite the glass substrate) the SiOG backplane, to bridge at least a portion of the gap, if not the entire gap, between Si tiles as shown in FIG. 4 and described above and in further detail below.

Currently, the largest silicon wafers commercially available at reasonable cost are 200 mm (8") in diameter, limiting the square silicon tile size to approximately 150 mm×150 mm (6"×6"). Rectangular tiles can be occasionally used depending on the size of the flat-panel glass substrate to which they are attached. However, the majority of radiographic applications require imaging arrays of greater dimension. For example, mammography requires 240 mm×300 mm, and chest radiography requires 350 mm×430 mm or 430 mm×430 mm. Therefore, for the majority of radiographic imaging applications, the imaging array dimension required will exceed the size of a single silicon tile. In response, multiple silicon tiles can be used, but suffer from distortion due to the tiling boundaries resulting from these arrays. Since the tiling gaps are approximately 2 mm or more and rarely less than approximately 500 microns, and pixel dimensions in radiographic arrays range from 50-80 microns for mammography to 100-150 microns in general radiology, important regions of anatomy can be missed in a radiograph having tiling boundaries.

Figure 4:
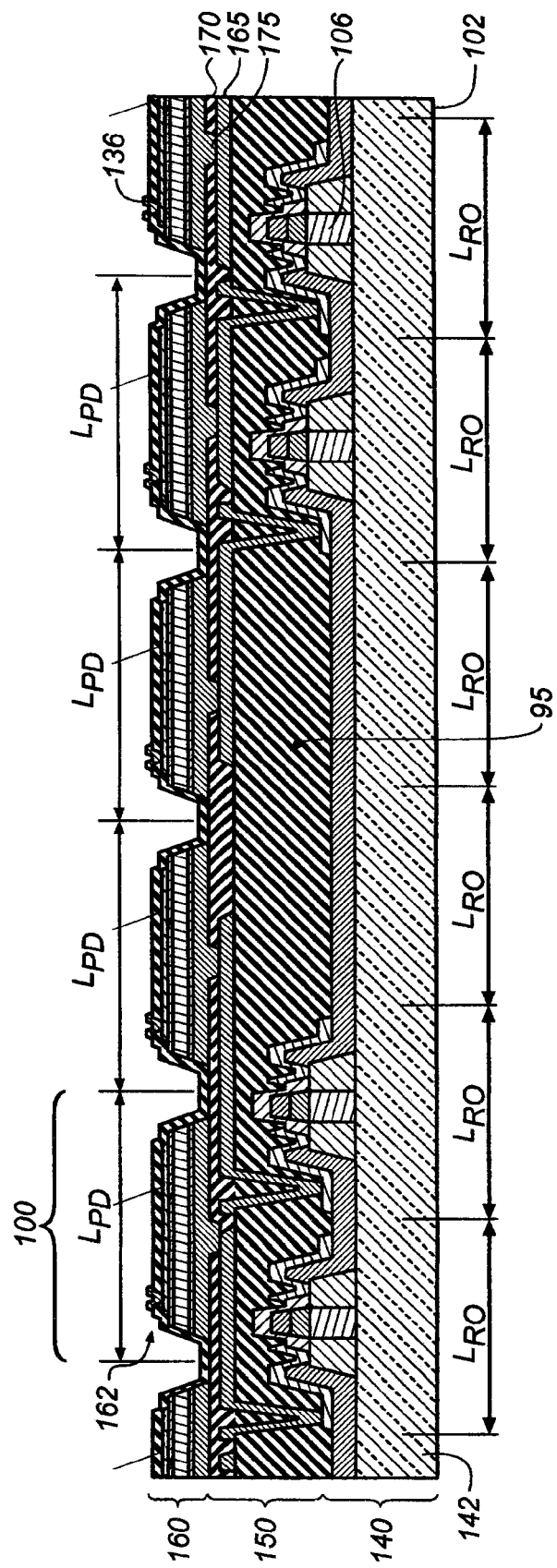
FIG. 4 is a cross section of an imaging array according to an embodiment where the photodiode pitch is greater than the readout pitch.

FIG. 4 shows a cross section of another embodiment, similar to the embodiment shown in FIG. 3, but can include multiple tiled silicon layers 106 arranged side-by-side forming tiling gaps 95. Similar elements and structures previously shown and described with reference to FIG. 3, will not be repeated in the description of FIG. 4. FIG. 4 differs from FIG. 3 in the addition of another metal layer 165 and dielectric layer 170 formed in interconnect layer 150. By adding these two layers and adjusting the pitch of the photosensors 162 $L_{PD}$ relative to the pitch of the readout elements 142 $L_{RO}$, the tiling gap 95 formed by the multiple silicon layers 106 can be covered and the corresponding space successfully used by the imaging array. As shown in FIG. 4, the pitch $L_{PD}$ of each photosensor 162 in the frontplane 160 can be greater than the pitch $L_{RO}$ of each readout element 142 in the backplane 140, i.e. $L_{PD} > L_{RO}$. By adjusting this ratio, the tiling gap 95 formed by the multiple thin single-crystal silicon layers 106 (two shown) can be covered and the entire SiOG substrate can be utilized.

FIGS. 5A-5C to 6A-6C illustrate methods of manufacturing imaging arrays according to embodiments. In FIG. 5A(1) and as previously discussed, the SiOG substrate can be prepared. The thickness of the silicon layers 100 on the glass 102 can be about 50 nm-200 nm. The silicon layers 100 are separated into tiles, each tile being approximately 150 mm×150 mm, and approximately 1.5 mm tiling gaps 95 are present between the silicon tiles 100.

The silicon tiles 100 are then patterned to form individual silicon islands 106, which will be the location of each transistor (or readout element) in the backplane, as shown in FIG. 5A(2). In FIG. 5A(3) the readout elements in the backplane 140 are formed by depositing a gate oxide 110 (e.g., silicon dioxide about 100 nm thick), depositing a first level of metal 112 (e.g., a tri-layer of about 50 nm Mo, about 200 nm Al:Nd and about 50 nm Mo), patterning the first level metal 112 and gate oxide 110, and pattern-wise doping the source and drain areas 108. P-type doping can be used for PMOS and N-type doping can be used for NMOS.

In FIG. 5A(4), a dielectric (e.g., silicon dioxide or silicon nitride about 400 nm thick) can be deposited and patterned to form an inter-metal dielectric 114 and a second level of metal 118 (e.g., about 200 nm of Mo) can be deposited to form an interconnect and a source-drain contact. FIG. 5A(1) to 5A(4) complete the fabrication of backplane 140. The pixel pitch for each readout element in the backplane is labeled as $L_{RO}$. For general radiology applications, this pixel pitch can be about 150 microns.

In FIGS. 5B(5) to (7), an interconnect between the backplane and the frontplane is formed. In FIG. 5B(5), one or more dielectrics (shown as 119) are deposited over the backplane 140 to isolate the backplane 140 from the frontplane 160. This dielectric can be relatively thick, e.g., about 500 nm-2,000 nm have a low dielectric constant to minimize capacitive loading of the backplane 140 and provide planarization of the topography in the backplane 140. However, one of ordinary skill in the art will recognize that the thickness of this dielectric layer 119 can vary depending on, for example, design considerations, circuit requirements, etc. Examples of dielectric stacks which can be used include, for example, 200 nm of silicon nitride and 400 nm of silicon dioxide, and about a 1-micron thick layer of as benzocyclobutene (BCB) and a 400 nm layer of silicon nitride. The inter-level dielectric 119 can be patterned to form via regions 121 for interconnection of the photosensors 162 in the frontplane 160 and the transistors or readout elements 142 in the backplane 140, as well as to provide bond-pad access around the periphery of the array. The pitch of the vias 121 patterned in the dielectric is shown as $L_{RO}$ in FIGS. 5A(4) to 5B(5). A third level of metal 165 can be deposited and patterned to form interconnects between the readout elements 142 in the backplane 140 and the photosensors 162 in the frontplane 160 as shown in FIG. 5B(6). The metal level 165 can also be used as an additional interconnect in the peripheral circuitry.

In FIG. 5B(7), a dielectric 170 can be deposited over the third level of metal 165 and patterned to form vias 175 for contact to the photosensors 162. The pitch of the vias 175 patterned in this dielectric is $L_{PD}$. FIG. 5B(7) shows the array after fabrication of the interconnect layer between the backplane and frontplane. The interconnect metallization 165 in this layer connects readout elements 142 in the backplane 140 with pitch $L_{RO}$, to photosensitive elements 162 in the frontplane 160 with pitch $L_{PD}$. This completes the fabrication of the interconnect region between frontplane 160 and backplane 140.

The fabrication of the frontplane 160 is illustrated in FIGS. 5C(8) to (10). In FIG. 5C(8), the cathode electrode metallization 122 can be deposited and defined, including having a pitch $L_{PD}$. The cathode metallization 122 can also be used for additional interconnects to the peripheral circuitry. The photosensor 162 can be then fabricated as shown in FIGS. 5C(9) to (10). As shown, an amorphous silicon PIN photodiode can be formed by subsequent deposition of about 50 nm N+ doped amorphous silicon 124, about 500 nm intrinsic amorphous silicon 126, about 20 nm P+ doped amorphous silicon 128, and about 10 nm of, e.g., ITO (Indium Tin Oxide), to form a transparent electrode 130 as the anode for the photodiode 162. The ITO 130 can be patterned, followed by patterning of the amorphous silicon stack. A passivation dielectric 132, e.g., about 200 nm of silicon nitride, can be deposited over the array and patterned to form contact areas for the PIN photodiode anode 130. Finally, in 5C(10), a top level of metallization 136 (not shown), e.g., a stack of about 50 nm Mo, about 200 nm Al:Nd and about 50 nm of Mo, can be deposited and patterned to form bias lines for the photosensor anode 130. The level of metallization 136 can also be used for additional interconnects to the peripheral circuitry.

As will be understood by one of ordinary skill in the art, additional layers of inorganic or organic dielectrics can be deposited and patterned for encapsulation and to improve optical performance of the formed imaging arrays. Additional layers of conductors, such as ITO, can be deposited and patterned for TAB bonding purposes also.

Figure 6A:
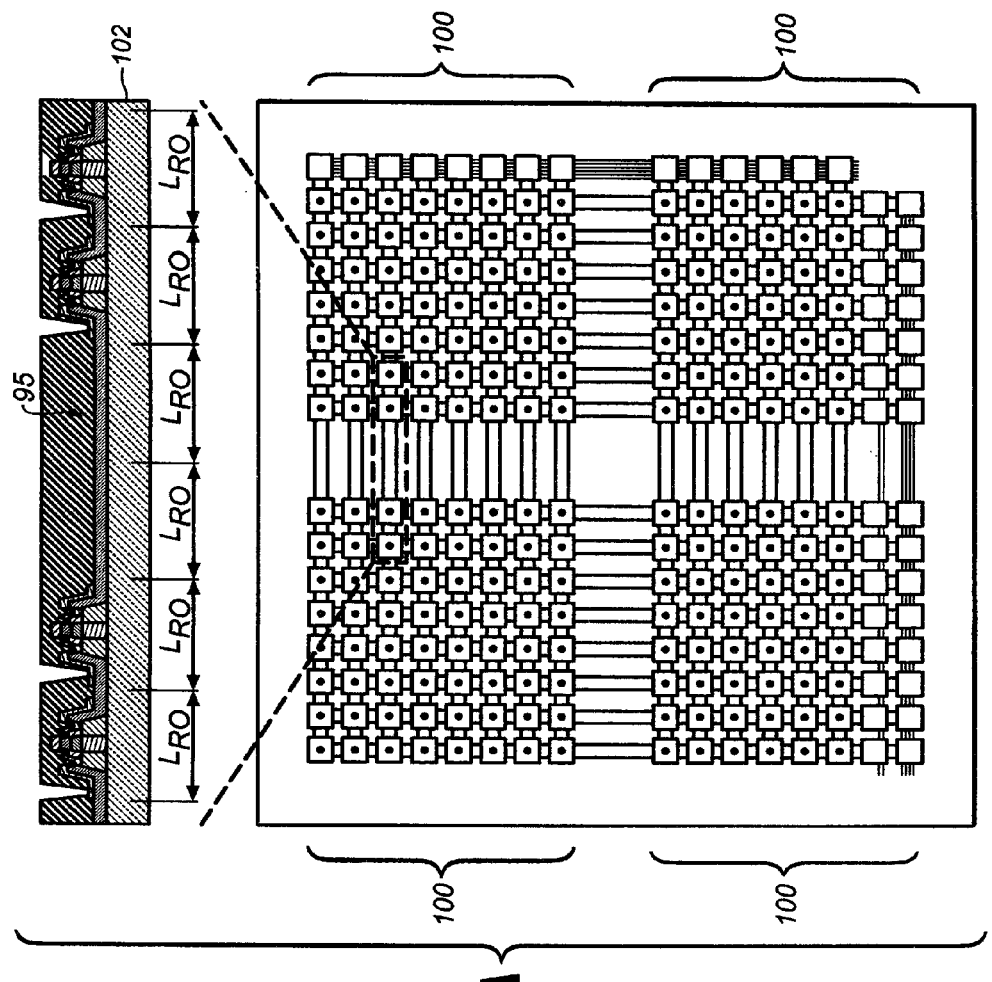
FIGS. 6A-6C show a cross section and a top down view of various fabrication stages of an imaging array according to an embodiment.
Figure 6B:
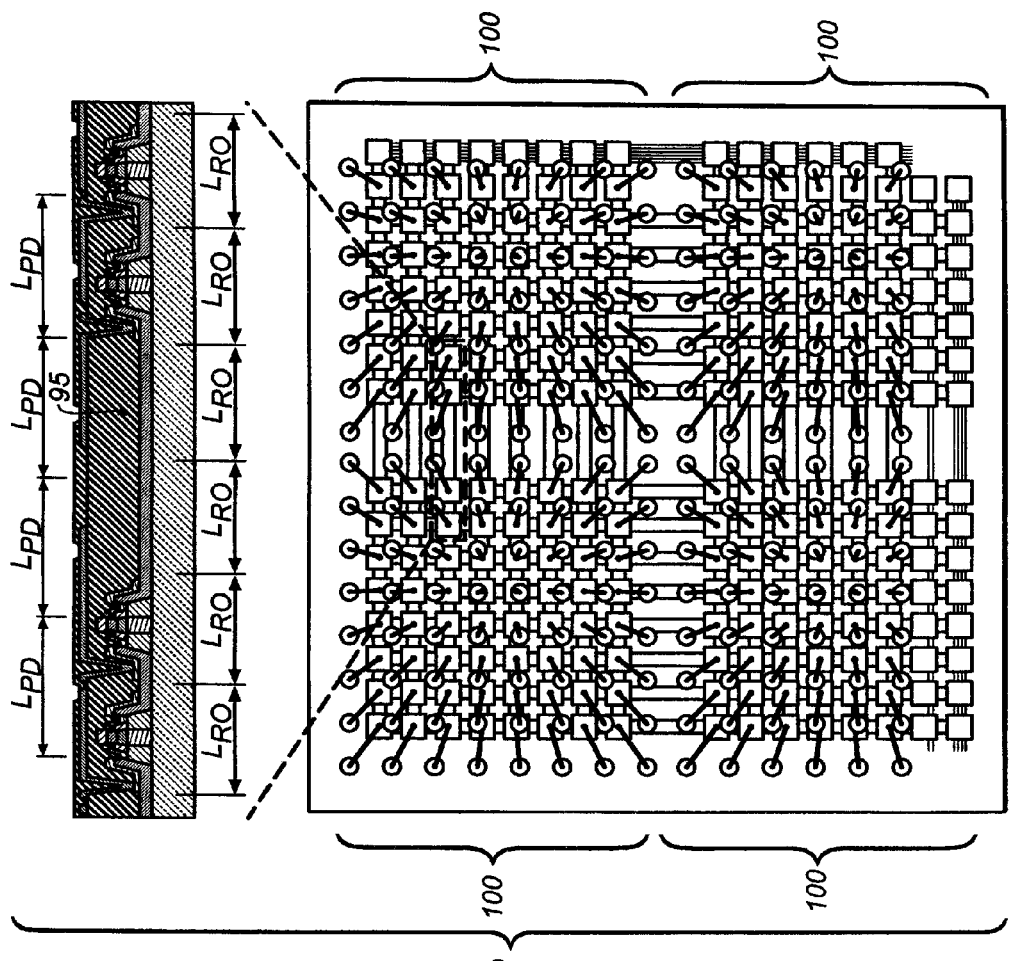
Figure 6C:
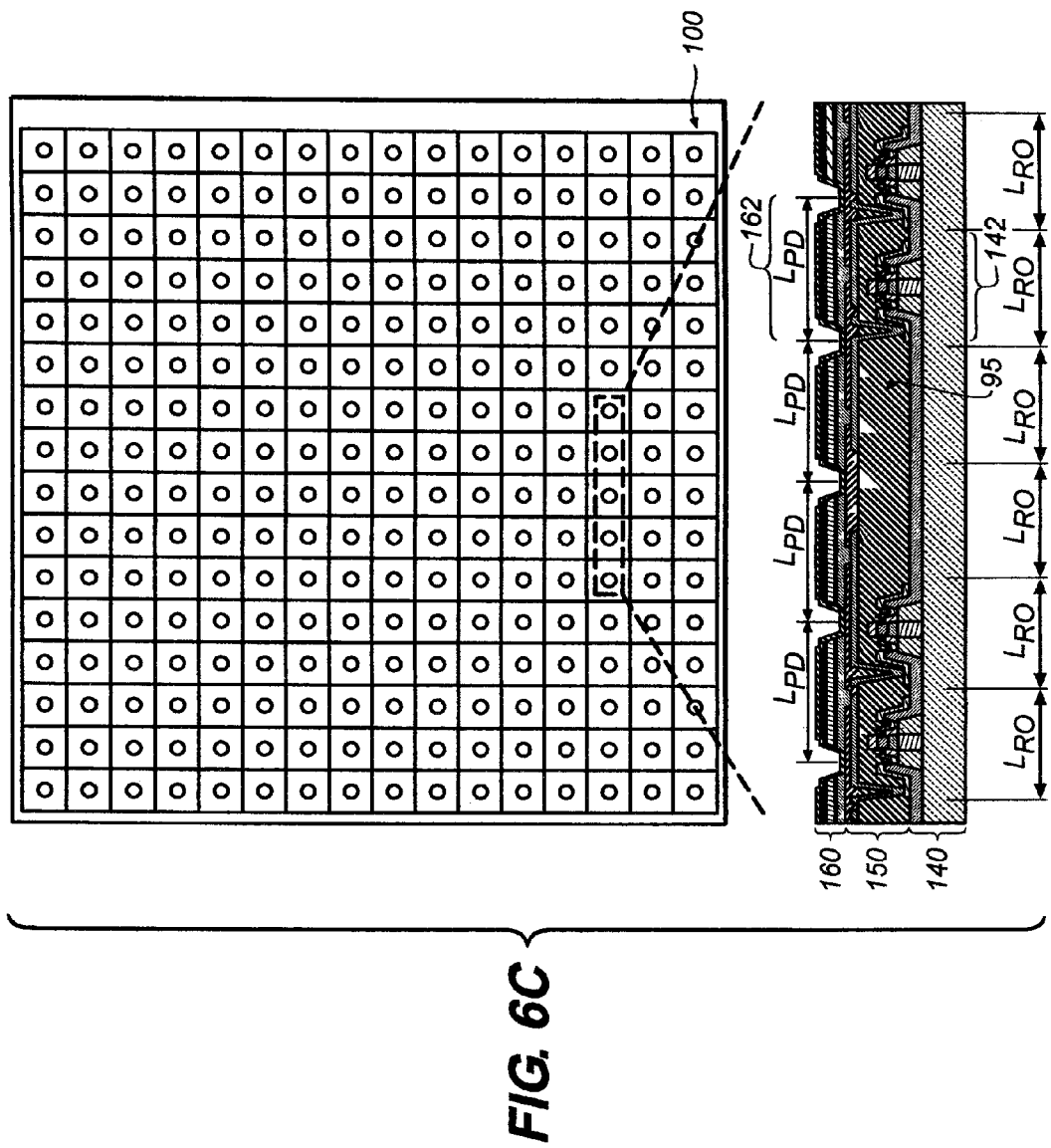

FIGS. 6A-6C show top-views and cross-sections of embodiments of the imaging arrays on a SiOG substrate after various stages of fabrication. FIG. 6A shows the SiOG substrate following fabrication of the backplane with readout arrays. The backplane can be all of the pixel electronics with the exception of the photodiode arrays. As discussed with reference to FIG. 5A-5C, the fabrication of the imaging arrays can be performed using flat-panel process technology in which layers are deposited and defined photolithographically over the entire glass substrate. Embodiments include clock, bias and signal readout interconnects patterned across multiple silicon tiles. For example, row address circuitry can be fabricated on one or both sides of a glass panel and signal readout circuitry can be fabricated along the top and/or bottom of a glass panel.

FIG. 6B shows the imaging array after fabrication of the frontplane. The element pitch on the frontplane $L_{PD}$ allows bridging of the tiling gap 95 formed by the multiple silicon tiles 100. As described earlier, an embodiment for use in general radiology and fabricated on silicon-on-glass substrates with about 150 mm×150 mm silicon tiles and about a 2 mm tiling gap 95 between silicon tiles, will have a pitch of about 150 microns on the backplane and about 152 microns on the frontplane in order to bridge the tiling gaps 95.

FIG. 6C illustrates a cross-section of an imaging array at the tiling boundary, including an array of vertically integrated a-Si photodiodes with pitch $L_{PD}$ for an array of photodiodes and an array of readout elements with pitch $L_{RO}<L_{PD}$ such that the photodiodes bridge the tiling gap 95 between SiOG layers. As shown, an arbitrarily large imaging array can be formed on a glass substrate in which the imaging frontplane can be continuous across the tiled backplane. Since present flat-panel display glass substrates are available up to Generation 10 glass substrates with a dimension of about >3 meters×3 meters, very large imaging arrays with increased performance are possible using exemplary embodiments herein.

In another embodiment, the pitch of the photodiodes in the frontplane can be different from the pitch of the readout elements in the backplane only for pixels proximate to the tiling boundaries. For example, the imaging array also can include a backplane array including readout elements formed in the single-crystal silicon substrates, each readout element having a pitch $L_{RO}$, and a frontplane array including photosensitive elements above and on the side of the readout array opposite the insulating substrate, each photosensitive element having a pitch $L_{PD}$. The frontplane is electrically connected to the backplane, and in the proximity of the tiling gap $L_{PD}>L_{RO}$ such that the photosensitive elements cover at least a portion of the tiling gap. The condition $L_{PD}>L_{RO}$ can be achieved by increasing $L_{PD}$ in the proximity of the of the tiling gap as compared to $L_{PD}$ not in the proximity of the tiling gap, by decreasing $L_{RO}$ in the proximity of the tiling gap as compared to $L_{RO}$ not in the proximity of the tiling gap, or both. By decreasing the number of pixels to be adjusted from all to only a portion thereof, the layout and process complexity can be reduced. For example, the horizontal dimension of each of the photosensors in N boundary pixels near the edge of a vertical tile gap can be increased by an amount $\Delta L/2N$ where $\Delta L$ is the tiling gap 95. For example, for about a 1 mm tiling gap 95 in an array with a nominal 200 micron pixel dimension, each of the 10 pixels on either side of the gap can be increased by 50 microns to bridge the gap. Alternatively, the horizontal dimension of each of the readout elements in N boundary pixels near the edge of a vertical tile gap can be decreased by an amount $\Delta L/2N$ where $\Delta L$ is the tiling gap 95. Alternatively, the horizontal dimension of each of the readout elements near the edge of a vertical tile gap can be decreased and the horizontal dimension of each of the readout elements near the edge of a vertical tile gap can be increased to allow the photosensitive elements to bridge the tiling gap. The amount of adjustment in both the readout and photosensitive elements need not be a single fixed distance, but may vary depending on pixel position or distance from the tiling gap, providing the tiling gap is thereby substantially bridged. By decreasing the number of pixels being enlarged, the image captured by a sensing array or can be spatially filtered to correct for the change in pitch to the affected pixels.

In another embodiment, the pixels can be rotated along a 90 degree angle so the tiling gaps are not orthogonal. For example, the tiling gaps can be arranged at an angle of 45 degrees with respect to the horizontal and vertical dimensions of the imaging or display array. The horizontal and vertical element pitch can be increased either uniformly across the array or preferentially near the tiling gap to bridge the tiling gap, with appropriate increases for the horizontal and vertical pixel dimensions to account for the angle of the tiling gap with respect to the array.

Embodiments of the imaging array can be used in various forms of digital radiography. For example, an indirect digital radiography imaging panel acquires image data from a scintillating medium using an array of individual sensors, arranged in a row-by-column matrix so that each sensor provides a single pixel of image data, as shown in FIG. 7A.

Figure 7A:
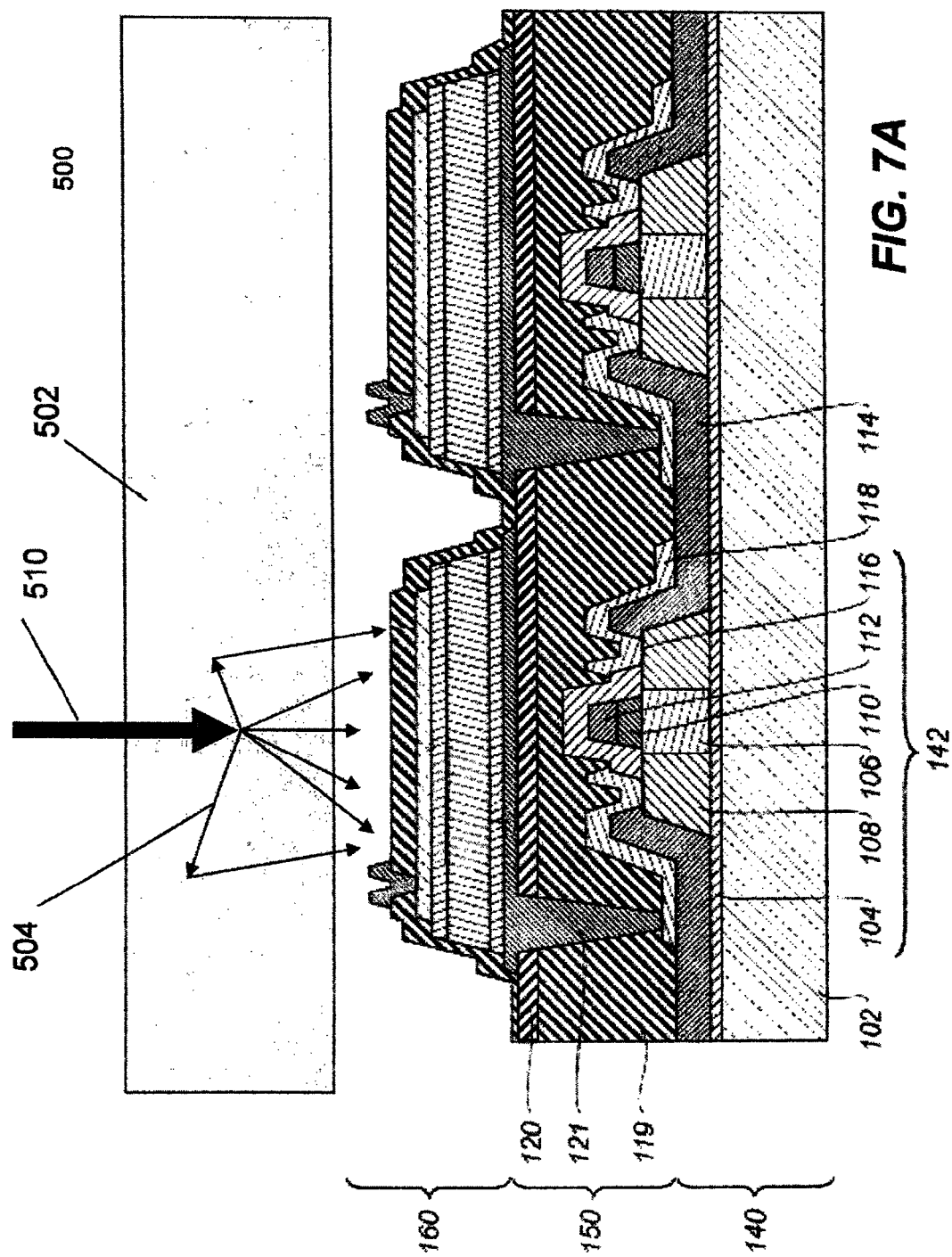
FIGS. 7A-7B show cross sections of digital radiography imaging panels according to embodiments.

In FIG. 7A, an X-ray detector 500 comprises a layer of X-ray converter material (e.g., luminescent phosphor screen 502), in proximity to the flat-panel imaging array. Phosphor materials used for the luminescent phosphor screen include powder phosphors, for example, $Gd_2O_2S(Th)$ and structured phosphors, for example, CsI(Tl). The material composition of the phosphor screen useful in the embodiments of the invention can include one or more of $Gd_2O_2S:Tb$, $Gd_2O_2S:Eu$, $Gd_2O_3:Eu$, $La_2O_2S:Tb$, $La_2O_2S$, $Y_2O_2S:Tb$, $CsI:Tl$, $CsI:Na$, $CsBr:Tl$, $NaI:Tl$, $CaWO_4$, $CaWO_4:Tb$, $BaFBr:Eu$, $BaFCl:Eu$, $BaSO_4:Eu$, $BaSrSO_4$, $BaPbSO_4$, $BaAl_{12}O_{19}:Mn$, $BaMgAl_{10}O_{17}:Eu$, $Zn_2SiO_4:Mn$, $(Zn,Cd)S:Ag$, $LaOBr$, $LaOBr:Tm$, $Lu_2O_2S:Eu$, $Lu_2O_2S:Tb$, $LuTaO_4$, $HfO_2:Ti$, $HfGeO_4:Ti$, $YTaO_4$, $YTaO_4:Gd$, $YTaO_4:Nb$, $Y_2O_3:Eu$, $YBO_3:Eu$, $YBO_3:Tb$, $(Y,Gd)BO_3:Eu$, combinations thereof, etc. X-ray photon path 510 and visible light photon paths 504 are also shown in FIG. 7A. When a single X-ray is absorbed by the phosphor, a large number of light photons are emitted isotropically. Only a fraction of the emitted light reaches the photodiode and gets detected.

Figure 7B:
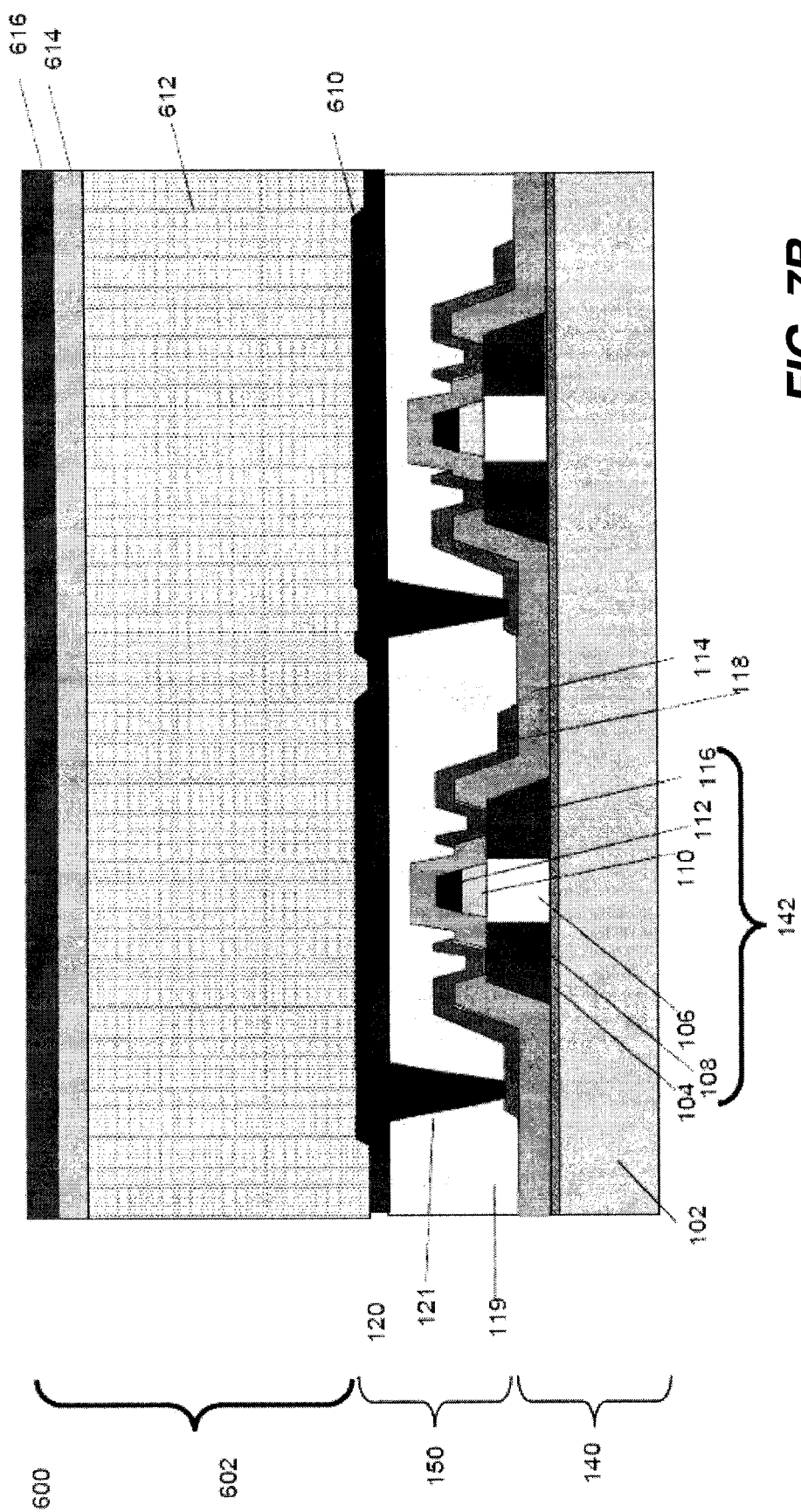

In a direct digital radiography imaging panel, as shown in FIG. 7B, a scintillating screen is not required. Rather, the photosensing elements are of sufficient thickness that a fraction (about >50%) of the incident X-rays are absorbed in the semiconductor layers in the photosensor, generating large numbers of electron-hole pairs. A sufficient electric field is provided across the photosensor that the electron-hole pairs are spatially separated and drift under the influence of the electric field to separate terminals of the photosensor. Semiconductor materials commonly used for the photosensor in direct radiography include amorphous selenium (a-Se), CdTe, HgI, PbI, etc. The photosensor in direct radiography is, for example, a photoconductor formed with semiconductor material formed in a layer of sufficient thickness that the layer can absorb equal to or greater than 20% of incident X-rays with energies between about 40 KEV and about 90 KEV. As illustrated in FIG. 7B, the imaging array is formed of a backplane 140 with transistors 142, an intermediate layer 150 and a frontplane 600. As shown, the frontplane can include of a pixel electrode 610, an amorphous selenium photoconducting material 612, an optional charge blocking layer 614 and an electrode 616. The charge blocking layer 614 prevents injection of carriers directly into the amorphous selenium by electrode 616. As one of ordinary skill in the art will know, direct X-ray detectors are generally well known in the technical literature.

While the invention has been illustrated with respect to one or more implementations, alterations and/or modifications can be made to the illustrated examples without departing from the spirit and scope of the appended claims. In addition, while a particular feature of the invention can have been disclosed with respect to only one of several implementations, such feature can be combined with one or more other features of the other implementations as can be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed can be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An imaging array, comprising:
    an insulating substrate bonded with at least one thin single-crystal silicon substrate having a thickness equal to or less than about 1 micron;
    a backplane array including readout elements formed in the at least one thin single-crystal silicon substrate; and
    a frontplane array including photosensitive elements formed on the backplane array on the at least one thin single-crystal substrate and opposite the insulating substrate, and electrically connected to the backplane array.

2. The imaging array of claim 1, wherein the thin single crystal substrate is bonded to the insulating substrate by an anodic bonding layer.

3. The imaging array of claim 1, where a portion of the readout elements include a pitch $L_{RO}$, a portion of the photosensitive elements include a pitch $L_{PD}$ and $L_{PD} > L_{RO}$ to cover at least a portion of a gap between at least two thin single-crystal silicon substrates.

4. The imaging array of claim 1, wherein the at least one thin single-crystal silicon substrate is formed by separating a single crystal silicon wafer at an internal separation layer.

5. An imaging array, comprising:
    an insulating substrate bonded to at least two single-crystal silicon substrates, wherein the at least two single-crystal silicon substrates are separated by a tiling gap;
    a backplane array including readout elements formed in the single-crystal silicon substrates, each readout element having a pitch $L_{RO}$; and
    a frontplane array including photosensitive elements on the backplane array and opposite the insulating substrate, the frontplane array electrically connected to the backplane array, and each photosensitive element having a pitch $L_{PD}$ wherein $L_{PD} > L_{RO}$ and the photosensitive elements cover at least a portion of the tiling gap.

6. The imaging array of claim 5, wherein $L_{PD}/L_{RO} = 1 + \delta L/L$ where L is the width of a single-crystal silicon substrate and $\Delta L$ is the tiling gap.

7. The imaging array of claim 5, wherein each of the at least two single-crystal silicon substrates have a thickness equal to or less than about 1 micron.

8. The imaging array of claim 5, wherein the insulating substrate is a glass substrate.

9. The imaging array of claim 5, wherein the at least two thin single crystal substrates are bonded to the insulating substrate by an anodic bonding layer.

10. The imaging array of claim 5, wherein forming the photosensitive elements includes forming one of, p-n junction photodiodes, PIN junction photodiodes, MIS sensors, pinned photodiodes, CCDs, avalanche photodiodes, phototransistors, photoconductors and charge injection devices.

11. The imaging array of claim 5, wherein forming the readout elements includes forming one of, transistors, diode switches, CCDs, bi-polar transistors, and field effect transistors.

12. An imaging array, comprising:
    an insulating substrate bonded to at least two single-crystal silicon substrates, each single-crystal silicon substrate having a perimeter, wherein the at least two single-crystal silicon substrates are separated by a tiling gap;

a backplane array including readout elements formed in the single-crystal silicon substrates, a portion of the readout elements having a pitch $L_{RO}$; and a frontplane array including photosensitive elements on the backplane array and opposite the insulating substrate, the frontplane array electrically connected to the backplane array, and a portion of the photosensitive elements having a pitch $L_{PD}$, wherein $L_{PD} > L_{RO}$ and the photosensitive elements including the pitch $L_{PD}$ cover at least a portion of the tiling gap.

13. The imaging array of claim 12, in which the pitch $L_{PDP}$ of the at least a portion of the photosensitive elements proximate the perimeter of the at least two single-crystal silicon substrates is greater than the pitch $L_{RO}$ of the readout elements, and the pitch $L_{PDC}$ of the photodiodes not proximate to the perimeter of the at least two single-crystal silicon substrates is substantially equal to $L_{RO}$.

14. The imaging array of claim 12, wherein each of the at least two single-crystal silicon substrates have a thickness equal to or less than about 1 micron, where another portion of the readout elements have a pitch $L_{RO}$, different than $L_{RO}$; and where another portion of the photosensitive elements have a pitch $L_{PD}$, different than $L_{PD}$.

15. The imaging array of claim 12, wherein the insulating substrate is a glass substrate.

16. The imaging array of claim 12, wherein the at least two thin single crystal substrates are bonded to the insulating substrate by an anodic bonding layer.

17. The imaging array of claim 12, wherein forming the photosensitive elements includes forming one of, p-n junction photodiodes, PIN junction photodiodes, MIS sensors, pinned photodiodes, CCDs, avalanche photodiodes, phototransistors, photoconductors and charge injection devices.

18. The imaging array of claim 12, wherein forming the readout elements includes forming one of, transistors, diode switches, CCDs, bi-polar transistors, and field effect transistors.

19. The imaging array of claim 1, comprising:
a scintillator on the frontplane array opposite the readout array.

20. The imaging array of claim 19, wherein the scintillator is selected from the group of: $Gd_2O_2S$:Tb, $Gd_2O_2S$:Eu, $Gd_2O_3$:Eu, $La_2O_2S$:Tb, $La_2O_2S$, $Y_2O_2S$:Tb, CsI:Tl, CsI:Na, CsBr:Tl, NaLTl, $CaWO_4$, $CaWO_4$:Tb, BaFBr:Eu, BaFCl:Eu, $BaSO_4$:Eu, $BaSrSO_4$, $BaPbSO_4$, $BaAl_{12}O_{19}$:Mn, $BaMgAl_{10}O_{17}$:Eu, $Zn_2SiO_4$:Mn, (Zn,Cd)S:Ag, LaOBr, LaOBr:Tm, $Lu_2O_2S$:Eu, $Lu_2O_2S$:Tb, $LuTaO_4$, $HfO_2$:Ti, $HfGeO_4$:Ti, $YTaO_4$, $YTaO_4$:Gd , $YTaO_4$:Nb, $Y_2O_3$:Eu, $YBO_3$:Eu, $YBO_3$:Tb , and $(Y,Gd)BO_3$:Eu, or combinations thereof.

21. The imaging array of claim 1, wherein the photosensitive elements absorb equal to or greater than 20% of incident X-rays with energies between about 40 KEV and about 70 KEV.

22. The imaging array of claim 21, wherein each photosensitive element is a photoconductor and includes one or more of the following semiconducting materials, amorphous selenium, amorphous silicon, CdTe, HgI or PbI.

* * * * *

UNITED STATES PATENT AND TRADEMARK OFFICE
CERTIFICATE OF CORRECTION

PATENT NO. : 8,129,810 B2  
APPLICATION NO. : 12/488074  
DATED : March 6, 2012  
INVENTOR(S) : Timothy J. Tredwell Page 1 of 1

It is certified that error appears in the above-identified patent and that said Letters Patent is hereby corrected as shown below:

In the Claims:

Column 14, Claim 20, line 14     Please replace "NaLTl" with --NaI:Tl--

Signed and Sealed this
Thirteenth Day of August, 2013

Teresa Stanek Rea
*Acting Director of the United States Patent and Trademark Office*